United States Patent [19]

Browne

[11] Patent Number: 4,626,677
[45] Date of Patent: Dec. 2, 1986

[54] CONTINUOUS NORMALIZER FOR AN ELECTRONIC CIRCUIT THAT COMPENSATES FOR EXTERNAL AND INTERNAL DRIFTS FACTORS

[75] Inventor: Edward M. Browne, Houston, Tex.

[73] Assignee: ESM International, Inc., Houston, Tex.

[21] Appl. No.: 655,343

[22] Filed: Sep. 27, 1984

[51] Int. Cl.$^4$ ............................................. H01J 40/14
[52] U.S. Cl. ................................ 250/214 A; 209/580; 250/226
[58] Field of Search ............... 250/214 R, 214 A, 226, 250/206; 209/580, 581, 582; 307/311

[56] References Cited

U.S. PATENT DOCUMENTS

| | | |
|---|---|---|
| 3,382,975 | 5/1968 | Hoover . |
| 3,521,074 | 7/1970 | Frobese . |
| 3,795,811 | 3/1974 | Weir ..................................... 250/226 |
| 3,899,415 | 8/1975 | Codding et al. . |
| 4,239,118 | 12/1980 | Lockett . |
| 4,352,559 | 10/1982 | Gorgone et al. ................ 250/214 R |

Primary Examiner—Edward P. Westin
Attorney, Agent, or Firm—Vaden, Eickenroht, Thompson & Boulware

[57] ABSTRACT

A normalizer for a machine sorting individual items from a stream flowing in a channel having a background with reflectivity characteristics substantially identical to reflectivity characteristics of acceptable items. A photodetector produces an output which is amplified in three stages of amplification, dc coupled together, the second stage having an input adjustment for producing a zero voltage output for channel background reflectivity only. The output used for sorting purposes includes both positive and negative peaks. However, to prevent such peaks from greatly influencing normalizing action, the output of the second stage is applied through a limiter, which substantially clips both the positive and the negative peaks, to an integrator, which produces an average reference input voltage to the operational amplifier. DC offset to the input of the operational amplifier or because of changing operational conditions within the circuit gradually change the reference input voltage to the operational amplifier to compensate or normalize for drifting conditions. Peaks that are indicative of items to be sorted are hence adjusted to the normalized zero output of the second amplifier.

8 Claims, 1 Drawing Figure

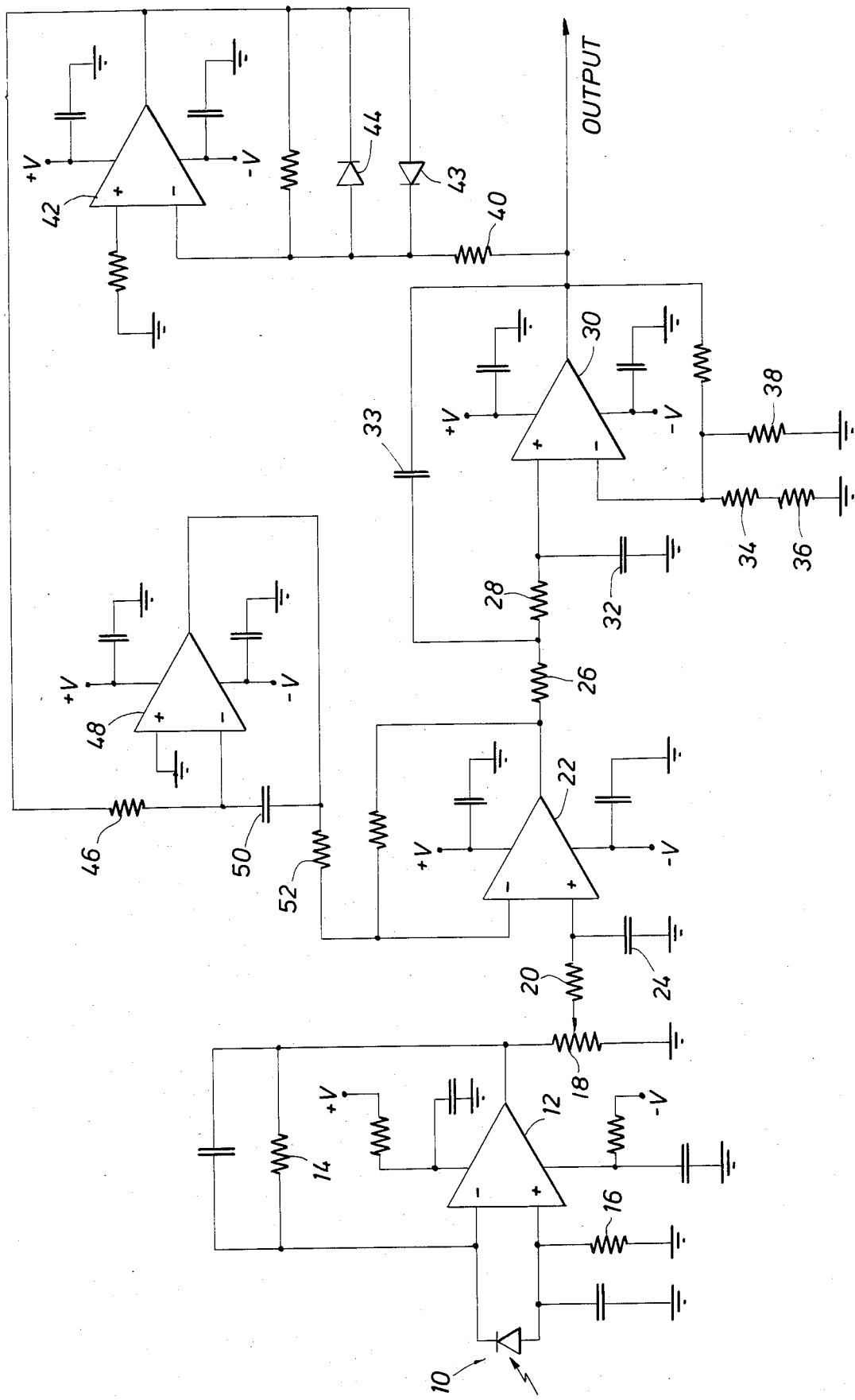

CONTINUOUS NORMALIZER FOR AN ELECTRONIC CIRCUIT THAT COMPENSATES FOR EXTERNAL AND INTERNAL DRIFTS FACTORS

BACKGROUND OF THE INVENTION

1. Field of the Invention

This invention pertains to normalizing and particularly with a normalizer that operates continuously and without requiring resetting of variable control settings.

2. Description of the Prior Art

Sorting of products according to color differences, typically employed for sorting small food products such as rice grains, beans, seed and the like, is commonly performed by automatic sorting machines incorporating optical detectors. Such a machine generally employs a hopper for receiving a bulk of the product to be sorted, a vibratory feeder for determining the flow rate of the product exiting from the hopper, and one or more channels or slides for the product from the feeder. While the product is sliding down a channel, it is aligned and singulated so that as the product leaves the slide it is in a "stream" of product which can easily be "observed" using photodetectors.

The area behind the stream is painted or otherwise treated to have a background appearance for photodetection purposes which is substantially identical to the appearance of an acceptable product. That is, its color and reflectivity characteristics are the same as an acceptable product. Henceforth, this area will be called the "background". When products within an acceptable range of color are subsequently conveyed in front of the background, the photodetector detects nothing out of the ordinary and hence does not cause rejection of any of the product. However, when a product is conveyed which is either too dark in color or which is too light in color, this is a photodetectable non-acceptable product event. A signal is produced which subsequently produces an air jet or the like and the product is ejected from the channel. "Nonacceptable" may not mean that the rejected product is too ripe or not ripe enough or bruised, but merely not of the grade for which the sorter is preset to accept.

It is further true that machines of this type typically have many channels, each channel being subject to independent photodetection sorting in the manner described. This is because a single beam-width is capable of photodetection only with regard a compatible width channel. Furthermore, many of the products that are sorted create a dust environment as particles of the products are knocked free during product conveying. Hence, the optical lenses of the photodetection system are gradually dimmed over a period of time. Furthermore, the machines vibrate which may have an affect on changing adjustable potentiometers and the like. Machines that operate for a long period of time also heat up, which often cause additional changes in the values of electronic components. Finally, over a period of time, the aging of components often causes voltage changes. All of these factors, and perhaps others, have created a need for "normalizing" the sorting machines of the types described above during operation.

One type of normalizing employs two operational amplifiers, the second stage being capacitively coupled to the first. The first-stage amplifier is a high gain amplifier necessary for amplifying the small signals produced by the photodetector. This amplifier is followed by a gain adjustment. The capacitive coupling removes dc offset that is inherent in the first amplifier. The second amplifier receives another input against which the input from the first stage is compared to produce a zero output when the photodetector detects only background color. The gain adjustment provides a necessary variable component for this purpose. In addition, the second amplifier includes a null adjustment potentiometer for compensating for the offset developed in the second stage.

A third stage is dc coupled to the second stage, the third stage including a comparator with respect to an adjustable reference voltage setting. A product that is lighter in color than normal produces a positive voltage signal at the input to the third stage comparator. When this voltage is more positive than the reference voltage setting, the output of the comparator produces an output that results in rejection of the product. A similar comparator circuit is used for rejecting products which have a darker than normal color. It may be seen that it is extremely important that the output of the second stage remain constant at zero volts when no product is in view. Should the light level change as a result of lamp aging, dust accumulation on the viewer window, or the like, the output of the photodetector and thus the output of the first stage changes. For slow and gradual changes in condition, the capacitor charges to compensate. Of course rapid changes are coupled through to the second stage and, if large enough, result in a rejection of a nonacceptable item within the product stream.

Although the circuit described works fairly well, when several consecutive positive signals or several consecutive negative signals are received, there is a shifting of the apparent offset baseline, which will cause the circuit not to operate in rejection of products as intended. Further, the null adjustment of the second stage is a nuisance, particularly when there are many channels for each machine and two or more circuits for each channel: for instance, one for viewing the front of the product and one for viewing the rear of the product. Sometimes there are additional circuits involving "viewing" each separate channel from several perspectives, thereby multiplying the number of null adjustments accordingly.

Another type of normalizing circuit that has been employed that eliminates capacitively coupling together the first and second stages is a rather complicated circuit that ensures that the reference voltage to the second stage is adjusted when the background reference voltage changes outside of an acceptable range. This is reflected in a drifting away from the preestablished output of the first stage. The procedure includes periodically shutting off the machine to ensure only the presence of the background and then providing a correct feedback voltage from a digital-to-analog converted to place the second stage amplifier output at zero volts. In order that the circuit operates in the desired manner, logic circuitry including an oscillator for producing a clock pulse, electronic switches for stopping and staring the machine, sampling and reset networks are required. In short, this procedure is both complicated and expensive. Further, rapid dust accumulation that occurs between the periodic normalizing sequences just described are not compensated for at all.

A third type of normalizer utilizes a separate set of photodetectors for detecting when no products are in view of the sorting photodetectors. An electronic switch is closed so as to permit observing the background and changing the stored charge on the capacitor coupling the first and second stage amplifier with a reference voltage so that such stored charge value is equal to the difference between what the output of the amplifier is and what it should be. Again, switching is required and only then during the non-presence of product in the viewing area. Normalizing may not be performed often enough because of lack of interruptions in the product stream to dependably cause the overall system to function correctly as intended. Further, the compensating charge on the capacitor may decay if not reset over a period of time, resulting in a false normalizing operating change.

Therefore, it is a feature of the present invention to provide an improved normalizing network for a product sorting circuit which does not require an initial nulling adjustment, is unlikely to result in false baseline shifting, does not require shutdown of operation for normalizing and does not require detection of the non-presence of product in the viewing area in order to provide normalizing.

SUMMARY OF THE INVENTION

An optical detector or photodetector is positioned for receiving light reflections from a stream of product flowing in a channel having a background with color and reflectively that is substantially the same as an acceptable particle. Product that is lighter than the background results in a positive pulse from the background voltage from the photodetector. Product that is darker than the background results in a negative pulse from the background voltage from the photodetector. The pulses have predetermined duration limits. A high gain operational amplifier amplifies the signal. A gain adjustment potentiometer is connected to determine the input level to a second stage operational amplifier, to which the output of the first amplifier is dc coupled. A reference input to this operational amplifier is also supplied. The output of the operational amplifier is zero for a background only input without product being present.

Another amplifier is connected to the output of the second amplifier to provide additional amplification and to proivde low pass filtering for eliminating any noise from the operating system. It will be seen that average background detection results in an average zero output except for the presence of an offset provided by the amplifiers and the presence of unacceptable products, which cause positive and negative pulses to occur. The output of the third amplifier is connected to a subsequent network which is not part of this invention for comparison and subsequent operation of rejection mechanisms, as in prior art systems.

The output of the third amplifier is also applied through a limiter so as to remove the high peaks caused by the detection of unacceptable products and the output from the limiter is applied to an integrator having a nominal 2-second time constant. The output of the integrator is then applied as the reference voltage to the second amplifier stage.

Basically, the system integrates the dc error component of the signal caused by component offset and as a result of slow drift caused by the many operating conditions that cause such drift to occur. This component is then fed back so that the dc error is subtracted from the circuit voltage output. It is understood that "dc error" includes very, very low frequency changes and not only precisely dc.

BRIEF DESCRIPTION OF THE DRAWING

So that the manner in which the above-recited features, advantages and objects of the invention, as well as others which will become apparent, are attained and can be understood in detail, more particular description of the invention briefly summarized above may be had by reference to the embodiment thereof which is illustrated in the appended drawing, which drawing forms a part of this specification. It is to be noted, however, that the drawing illustrates only a preferred embodiment of the invention and is therefore not to be considered limiting of its scope as the invention may admit to other equally effective embodiments.

The drawing is a simplified schematic diagram of an improved normalizer in accordance with the present invention.

DESCRIPTION OF THE PREFERRED EMBODIMENT

And now referring to the drawing, a photodetector 10, placed so as to receive a signal representative of the color condition of the area reflected for detection, develops a voltage output dependent upon that condition. In the application of a photodetector used in conjunction with a sorting machine, the color of the background in the channel through which the products to be sorted are passed results in a voltage output which is applied to a first stage high gain amplifier 12. Since the output of the photodetector is quite small, the amplification provided by amplifier 12 is quite large. In a preferred embodiment of the invention, first stage gain is one million. The gain of operational amplifier 12 is determined by resistor 14 which is connected from the output to the inverting input of the operational amplifier and resistor 16, which is connected between the non-inverting input of amplifier 12 and ground. The signal gain is the small signal produced by photodiode 10 multiplied by the sum of these two resistors.

The output voltage of amplifier 12 is divided by gain control potentiometer 18 connected between the output of amplifier 12 and ground. Effectively this potentiometer operates as a gain adjustment for the circuit. The wiper of the potentiometer is applied through resistor 20 to the non-inverting input of operational amplifier 22. It should be noted that the output of amplifier 12 is dc coupled to the input of operational amplifier 22 through part of resistor 18 and resistor 20. There is no capacitor in series with these components. A capacitor 24 to ground is connected to the input of operational amplifier 22 to provide filtering.

The output of operational amplifier 22 is dc coupled through resistors 26 and 28 to the non-inverting input of operational amplifier 30, further filtering being provided by these resistors in conjunction with capacitor 32 connected between the non-inverting input and ground and resistors 34, 36 and 38, which are connected between the inverting input of operational amplifier 30 and ground, and capacitor 33 connected from the output of amplifier 30 to the junction between resistors 26 and 28.

Although not limited to these values of gain, the preferred embodiment operational amplifier 22 amplifies the signal applied thereto by a factor of ten and amplifier 30 amplifies the input applied thereto by a factor of five.

The output of amplifier 30 is applied through resistor 40 to the inverting input of operational amplifier 42. A first diode 44 is connected from the inverting input of amplifier 42 to its output so that the cathode of the diode is connected to the input and diode 44 is connected from the input of amplifier 42 to the output so that its cathode is connected to the output. The result of the diode connections is that large positve and negative amplitude signals from amplifier 30 are clipped and hence amplifier 42 is an inverting amplifier of the input from amplifier 30 without the impact of any large peak signals. The large peak signals, it may be recalled, are a result of the detection by photodetector 10 of product which is either lighter in color or darker in color than the background channel with which it operates.

The output from amplifier 42 is connected through resistor 46 connected to the inverting input of operational amplifier 48. A capacitor 50 is connected between the output of amplifier 48 and the inverting input of the amplifier. Resistor 46 and capacitor 50 determine the integration time constant for the integrator. The output of the integrator is taken from the output side of the capacitor, which is also the output of the amplifier, and is coupled through resistor 52 to the inverting input of operational amplifier 22. The effect of the connection to the inverting input of amplifier 22 is to subtract the very low frequency and dc offset voltage which are applied to and occur within the circuit which has just been described from the incoming signal.

Ordinarily, such a simple integration system would not work to effect normalizing since the dc component of the incoming signal would be detected and subtracted. However, the sorting machine is calibrated prior to sorting a particular product such that the long-term average value of the incoming signal from the product is considered to be zero at the output of amplifier 30. In order to be zero at the output of amplifier 30, the background which is detected by photodetector 10 does produce a input value, an initial calibration value, that is, at the input of amplifier 12. Long term deviations from such desired pre-calibrated value are considered errors and are compensated for by the circuit which has been described. Short term deviation from the pre-calibrated value, however, will have a negligible effect since a large effect has been eliminated by the limiting action provided by diodes 43 and 44.

If there are numerous defective products which are observed, which products are defective in the same direction, there can be some affect upon moving the dc base line. Under normal operating conditions, however, a time constant of two seconds is sufficient to minimize such affect when the product by and large is within an acceptable range.

It should be further noted that a more complicated limiter may be provided than the one shown, if desired. However, a simple limiter of the type shown has been all that is required under normal operating conditions to give satisfactory results.

While a particular embodiment of the invention has been shown, it will be understood that the invention is not limited thereto. Many modifications may be made and will become apparent to those skilled in the art.

What is claimed is:

1. A normalizer, comprising:
   a high gain amplifier connected for receiving an input voltage having a predetermined duration limit,
   an operational amplifier having a first input dc coupled to the output of said high gain amplifier and a reference voltage as a second input, said operational amplifier producing a zero output voltage with an input voltage of said reference voltage value and producing an output deviating from zero as the input voltage deviates from said reference voltage value, and
   a feedback network, including:
      a limiter connected to said operational amplifier for removing high peaks from the output of said operational amplifier, and
      an integrator having its input connected to said limiter and its output connected as a reference voltage to the second input of said operational amplifier for subtracting dc offset voltage from the input applied to the first input of said operational amplifier, thereby providing normalizing for a gradually changing input voltage and circuit operation conditions.

2. A normalizer in accordance with claim 1, and including a photodetector positioned for viewing a flow of products passing in front of a background, the output from said photodetector with only the background present determining said predetermined input voltage value.

3. A normalizer in accordance with claim 1, wherein said high gain amplifier is an operational amplifier.

4. A normalizer in accordance with claim 3, wherein said high gain operational amplifier has a gain of approximately one million.

5. A normalizer in accordance with claim 1, and including a potentiometer between said high gain amplifier and said operational amplifier.

6. A normalizer in accordance with claim 1, wherein multiple stages of amplification and a low pass filter are connected between said operational amplifier and said limiter.

7. A normalizer in accordance with claim 1, wherein said limiter clips positive peaks and clips negative peaks at predetermined values.

8. A normalizer in accordance with claim 1, wherein said integrator has a time constant much longer than the duration limit of said input voltage.

* * * * *